United States Patent [19]

Daniele et al.

[11] Patent Number: 4,614,908
[45] Date of Patent: Sep. 30, 1986

[54] MICRODEFLECTOR PROBE FOR ELECTROSTATIC VOLTMETERS

[75] Inventors: Joseph J. Daniele, Pittsford; Martin E. Banton, Fairport, both of N.Y.

[73] Assignee: Xerox Corporation, Stamford, Conn.

[21] Appl. No.: 600,061

[22] Filed: Apr. 13, 1984

[51] Int. Cl.$^4$ .............................................. G01R 29/12
[52] U.S. Cl. ..................... 324/458; 324/72; 324/457; 355/14 CH
[58] Field of Search ............... 324/457, 61 R, 458, 324/72, 72.5, 123 R, 455, 109, 158 P; 355/14 CH; 310/330, 332, 366; 340/870.37

[56] References Cited

U.S. PATENT DOCUMENTS

| | | | |
|---|---|---|---|
| 3,997,839 | 12/1976 | Dreyfus et al. | 324/109 |
| 4,100,484 | 7/1978 | Buchceit | 324/32 |
| 4,197,493 | 4/1980 | Juve et al. | 324/72 |
| 4,489,278 | 12/1984 | Sawazaki | 324/457 |

OTHER PUBLICATIONS

Dynamic Micromechanics on Silicon: Techniques & Devices, K. E. Petersen, IEEE Trans. on Electron Devices, vol. ED-25, No. 10, Oct. 1978, pp. 1241-1250.
The Mirror-Matrix Tube: A Novel Light Valve for Projection Displays, R. N. Thomas et al., Proceeding of the S.I.D., vol. 16/3, Third Quarter 1975, pp. 184-194.
DC Electrostatic Voltmeters and Fieldmeters, R. E. Vosteen, ES-WED-AM1, pp. 799-810.
Miniature Cantilever Beams Fabricated by Anisotropic Etching of Silicon, R. D. Jolley and R. S. Muller, Journal of Electrochemical Society, vol. 127, No. 12, Dec. 1980, p. 2750.
Micromechanical Accelerometer Integrated with MOS Detection Circuitry, K. E. Petersen et al., IEEE Trans. on Electron Devices, vol. ED-29, No. 1, Jan. 1982, pp. 23-27.

Primary Examiner—Stewart J. Levy
Assistant Examiner—David Yee
Attorney, Agent, or Firm—Frederick E. McMullen

[57] ABSTRACT

An electrostatic voltmeter with a microdeflector probe having a base, a flexible finger supported on the base in cantilever fashion, the finger deflecting in response to a potential difference thereacross, separate driven and variable capacitance electrodes on the finger sensing the charge voltage on the surface to be measured, the pickup electrode being electrically coupled to the driven electrode, the resulting charge voltage on the driven electrode changing finger deflection and altering the capacitive relationship between the base and the variable capacitance electrode; a predetermined reference voltage on the base; and a circuit for converting the change in capacitance between the base and the variable capacitance electrode to a signal representing the voltage on the surface. In an alternate embodiment, a second microdeflector is provided which changes capacitance between base and variable capacitance electrode in response to noise, and a control for adjusting the signal in response to the noise signal.

9 Claims, 5 Drawing Figures

MICRODEFLECTOR PROBE FOR ELECTROSTATIC VOLTMETERS

The invention relates to electrostatic voltmeters, and more particularly, to an improved probe for electrostatic voltmeters.

Electrostatic voltmeters are utilized to measure voltage on a surface, as for example the photoconductive surface of a xerographic system. There, it is often desirable to determine the voltage on the photoconductive surface at one or more locations in the xerographic process to determine the operating condition of the system, and the need to adjust, service or replace system components. Indeed, in some xerographic system applications, an electrostatic voltmeter is incorporated into and made an integral part of the system with a feed back loop employed to enable automatic resetting of one or more of the system process components in accordance with the voltage conditions detected by the electrostatic voltmeter.

As will be understood, electrostatic type voltmeters are desirable in that no physical contact with the surface whose voltage is being measured is required. In applications such as the xerographic system alluded to above, this is important in preventing damage or scratching of the relatively delicate photoreceptor surface. The electrostatic voltmeter probe, which is spaced opposite the surface whose voltage is to be measured and out of contact therewith, operates on the basis of a capacitive relation established with the surface, the surface itself forming in effect one plate of a capacitor with the probe sensing electrode the second plate. Circuitry is provided to translate the charge accumulated on the probe electrode to a signal representing the voltage detected.

The invention relates to an electrostatic voltmeter for measuring the voltage on a surface such as a photoconductive surface, comprising in combination: a probe having at least one microdeflector, the microdeflector including a base having a well therein; a flexible finger on the base spaced over the well, the well permitting the finger to deflect relative to the base; separate driven and sensing electrodes on the finger, the base and the electrodes cooperating to form a capacitive relationship between the base and each electrode; and means for bringing the driven electrode into capacitive relation with the surface so that a charge representative of the voltage on the surface is produced on the driven electrode to cause the finger to deflect, deflection of the finger changing the capacitive relation between the base and the sensing electrode; and means for converting a change in capacitance between the base and the sensing electrode to a signal representing the voltage on the surface.

IN THE DRAWINGS

Figure 1:
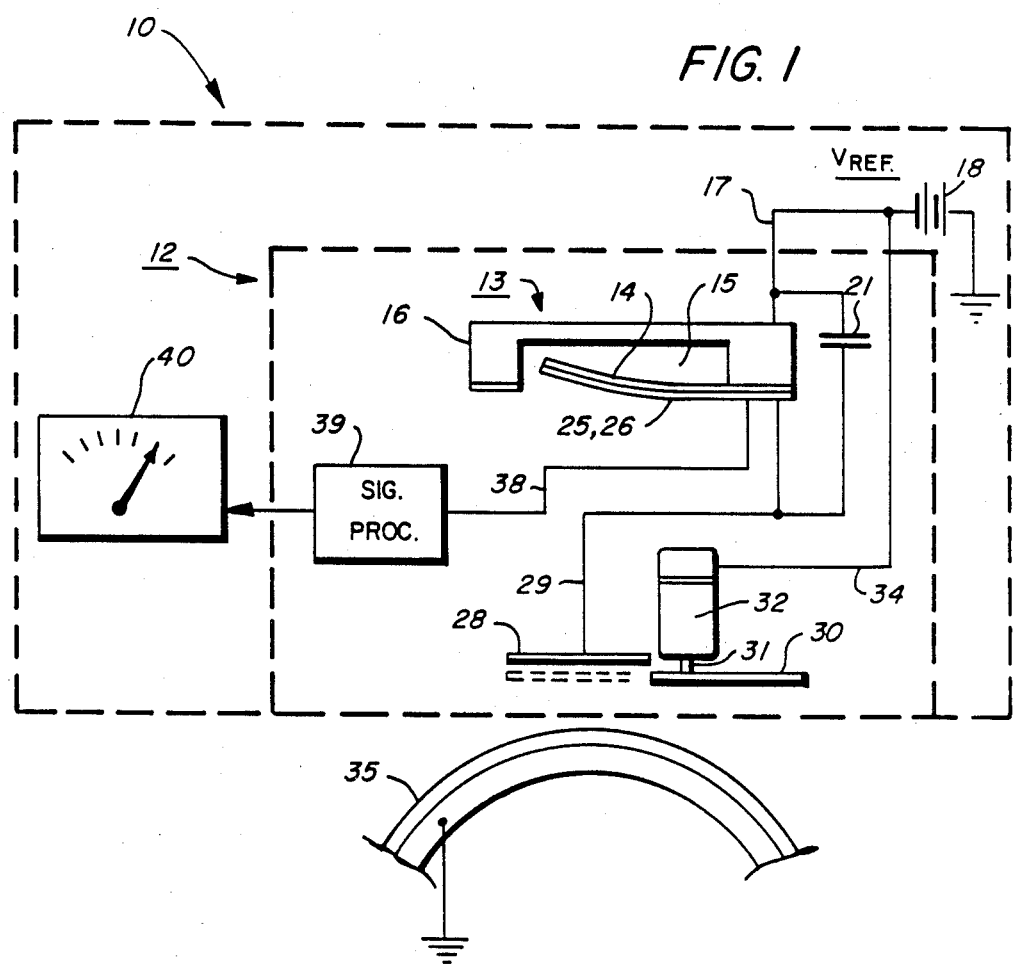
FIG. 1 is a schematic view of the electrostatic voltmeter of the present invention incorporating the microdeflector probe of the present invention.
Figure 2:
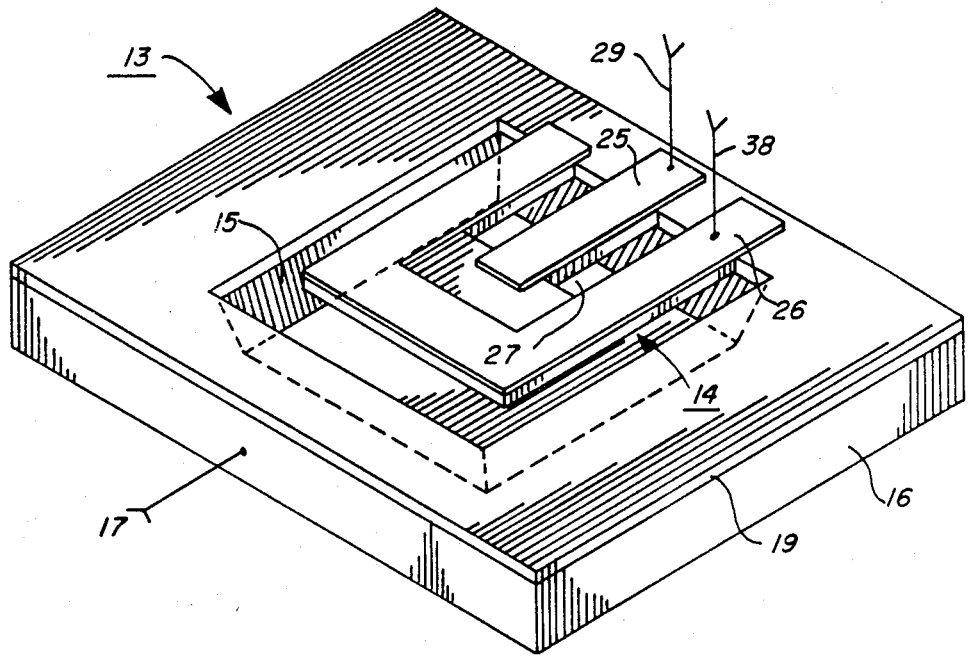
FIG. 2 is an enlarged partial isometric view showing details of the microdeflector probe.

Referring to FIGS. 1 and 2 of the drawings, an electrostatic voltmeter or ESV, designated generally by the numeral 10, and incorporating the microdeflector probe 12 of the present invention, is there shown. As will be understood by those skilled in the art, ESV's are typically employed to sense the voltage level on the photoconductive surface, designated by the number 35 herein, of a xerographic type copier or printing machine (not shown). In copiers or printing machines of the type alluded to, the photoconductive surface 35 is uniformly charged to a predetermined level by suitable charging means such as a corotron, and thereafter exposed to the original being copied. The latent electrostatic image created on the photoconductive surface is thereafter developed and the developed image transferred to a copy sheet and fixed. The photoconductive surface 35 is cleaned and charged again to repeat the process.

In machines of the type described, it is often desirable or necessary to determine the voltage on the photoconductive surface 35 at some point or points during the xerographic process, and for this purpose, the probe of an ESV is placed in predetermined operational relation to the photoconductive surface 35. The voltage measured by the ESV may be indicated visually to the user or operator on a meter or scale, or may be input directly to the machine controller for use by the controller in setting or adjusting the operating level of one or more of the xerographic processing components, such as for example the charge corotron.

While the present invention is described in a copier or printing machine environment, the invention is not to be considered limited to these applications, but may be used in any application where the voltage level on a surface is to be measured.

Probe 12 of ESV 10 incorporates a microdeflector 13 in the form of a flexible finger 14 disposed in cantilever fashion opposite a recess 15 in a rigid base or chip 16. Preferably, base 16 is formed from silicon, and is coupled to a suitable reference potential 18 by line 17.

Finger 14 and base 16 effectively form a capacitor, the capacitance of which changes with deflection or bending of finger 14. By monitoring the change in capacitance, the voltage applied to the microdeflector 13 is measured as will appear.

Finger 14, which is preferably silicon dioxide, has inner driven electrode 25 and outer variable capacitance electrode 26 thereon, outer electrode 26 having a generally U-shape and being separated from inner electrode 25 by a space 27 to electrically isolate the electrodes 25, 26 from one another.

Microdeflector 13 may be formed by reacting one surface of a silicon chip with oxygen to form a silicon dioxide layer 19 of desired depth. Selective etching may be used to remove the silicon material underlaying the silicon dioxide layer to provide recess 15 and delineate finger 14. Electrodes 25, 26 are preferably formed by coating the outer surface of finger 14 in the desired electrode pattern with suitable metals such as Chromium and Gold. A microdeflector having a finger 14 with a free standing length (L) of 100 um spaced a distance (D) of 10 um from base 16, and having a thickness (T) of 0.5 um with electrodes 25, 26 having a thickness of 15 nm chromium and 35 nm gold has been found suitable.

Probe 12 includes a pickup electrode 28, which may be formed from any suitable conductive material such as gold, electrically coupled to the parallel combination of a voltage division capacitor 21 and the driven electrode 25 of microdeflector 13 by conductor 29. Pickup electrode 28 may be of any suitable shape such as rectangular and of a size selected to provide a charge sensing surface of desired area. During use of ESV 10, pickup electrode 28 is positioned in predetermined spaced capacitive relation to the surface 35.

Voltage division capacitor 21 serves two functions. Since $V_{PR}-V_{ref}$ can be of the order of hundreds of volts which may be higher than can normally be accommodated by microdeflector 13, it is necessary to divide the voltage $V_{PR}-V_{ref}$ between electrode 28 and driven electrode 25. The rules of capacitive voltage division show that the smaller fraction of a voltage applied across two capacitors in series appears across the larger capacitance. In practice, the capacitance of driven electrode 25 ($C_{DR}$), when compared to the capacitance of pick-up electrode 28 ($C_{PE}$), is relatively small. Thus, the capacitance of the voltage division capacitor 21 ($C_{VD}$) is chosen greater than $C_{PE}$ to provide the desired division ratio. Since $C_{VD} > C_{PE} > C_{DR}$, voltage division capacitor 21 also makes the voltage appearing across the driven electrode 25 insensitive to changes in the capacitance ($C_{DR}$) which result from changes in the voltage on the photoreceptor $V_{PR}$. Both the above affects are contaained in the relationship between the voltage on the driven electrode $V_{DR}$ and the voltage on the photoreceptor $V_{PR}$:

$$V_{DR} = \frac{C_{PE}}{C_{PE} + (C_{DR} + C_{VD})} \times (V_{ref} - V_{PR})$$

where
$C_{PE}$ is the capacitance of pickup electrode 28,
$C_{DR}$ is the capacitance of driven electrode 25,
$C_{VD}$ is the capacitance of voltage division capacitor 21,
$V_{PR}$ is the voltage on photoconductive surface 35, and
$V_{ref}$ is the reference voltage 18 applied to base 16.

Since $C_{VD} >> C_{DR}$ we have $$V_{DR} = \frac{C_{PE}}{C_{PE} + C_{VD}} \times (V_{ref} - V_{PR})$$

A shutter 30 is provided for periodic imposition between pickup electrode 28 and the surface 35. Preferably, shutter 30 comprises a plate like semi-circular shaped metal part supported for rotation on the shaft 31 of a suitable shutter drive motor 32. Energization of motor 32 rotates shutter 30 at a predetermined rate to periodically interpose shutter 30 between pickup electrode 28 and surface 35 as will appear. Conductor 34 couples shutter 30 to potential source 18.

A suitable signal processing circuit 39, which may for example comprise a capacitive voltage divider, is provided. Conductor 38 couples variable capacitive electrode 26 to the input of signal processing circuit 39. The output of signal processing circuit may be coupled to a suitable readout device, shown here as voltmeter 40, to provide a visual scale readout of the voltage measured by ESV 10 on photoconductive surface 35. Alternately, ESV 10 may be integrated into the aforementioned machine controller, with the signal output of circuit 39 used by the machine controller to control one or more of the machine components in accordance with the voltage sensed.

In use and presuming shutter 30 to be retracted, probe 12 of ESV 10 is disposed in operative relation with the photoconductive surface 35 with pickup electrode 28 spaced a predetermined distance therefrom, and the reference voltage (Vref) applied to base 16 of microdeflector 13. Flexible finger 14 bends or deflects by an amount determined by the voltage on photoconductive surface 35 ($V_{PR}$). Signal processing circuit 39 outputs a signal representing the voltage on surface 35.

A change in the charge $V_{DR}$ on driven electrode 25 induces a change in the amount of deflection of finger 14 and a corresponding change in the capacitance between variable capacitance electrode 26 and base 16. Signal processing circuit 39 responds by outputting a signal reflecting the change in capacitance of electrode 26 as a measure of the voltage on the photoconductive surface 35. As discussed, the signal output of circuit 39 may be read by a suitable meter such as voltmeter 40. Alternately, the signal may be input to the machine controller and used by the controller to adjust one or more of the machine processing components.

Both preceding initial operation and periodically during operation, it is necessary to calibrate probe 12 to accommodate drift such as for example due to charge leakage. Accordingly, motor 32 is energized at start-up and periodically during operation to rotate shutter 30 at a relatively slow rate (i.e. once every 10 seconds) to interpose shutter 30 between pickup electrode 28 and the photoconductive surface 35 for calibration purposes. Disposition of shutter 30 opposite pickup electrode 28 results in there being no voltage across the capacitor formed by electrode 25 and base 16. The charge on variable capacitance electrode 26 may now be read using meter 40 to determine if ESV 10 is adjusted correctly.

Figure 3:
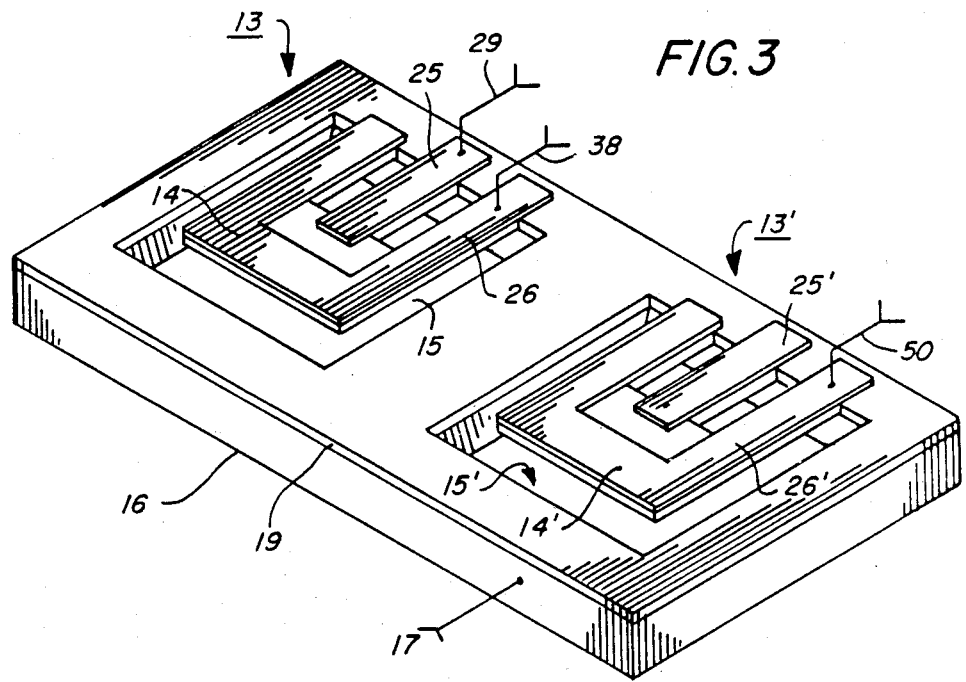
FIG. 3 is an isometric view of an alternate microdeflector probe construction in which compensation for the presence of any extraneous system noise is provided.
Figure 4:
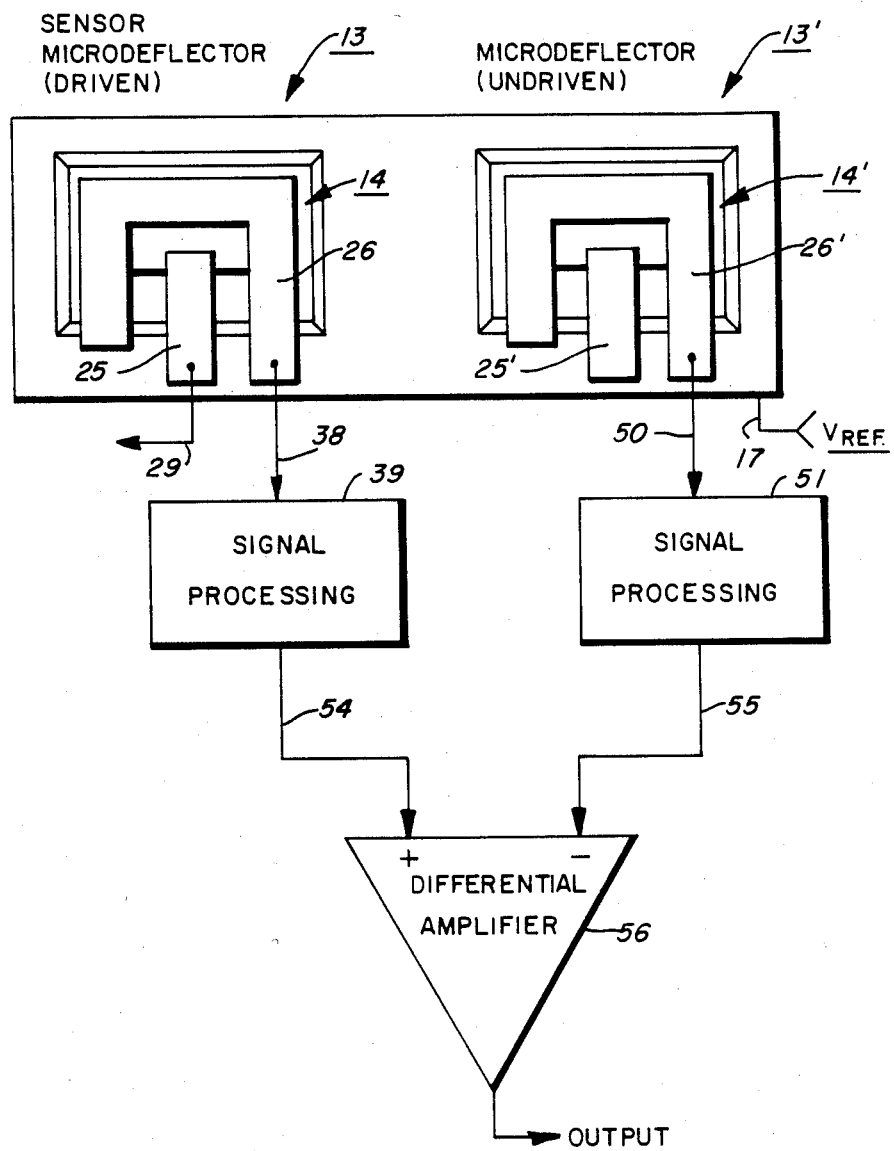
FIG. 4 is a circuit schematic for the noise compensating microdeflector probe shown in FIG. 3.

In the embodiment of FIGS. 3 and 4, where like numerals refer to like parts, there is shown a probe construction designed to compensate for the effects of extraneous noise, which may take the form of high frequency virbrations, ambient temperature conditions, etc. on probe 12. In this embodiment, a second microdeflector 13' is provided alongside microdeflector 13 on base 16, microdeflector 13' having a flexible finger 14' disposed in cantilever fashion opposite a second recess 15' in base 16. Flexible finger 14' is identical to the finger 14 described heretofore with inner driven electrode 25' and outer variable capacitance electrode 26'.

In this embodiment, microdeflector 13 functions as the charge sensing unit with driven electrode 25 thereof being coupled by conductor 29 to pickup electrode 28 while variable capacitance electrode 26 is coupled by conductor 38 to signal processing circuit 39 as described in connection with the FIGS. 1 and 2 embodiment. Variable capacitance electrode 26' of microdeflector 13' is coupled by conductor 50 to a second signal processing circuit 51 while driven electrode 25' thereof is left uncoupled. As in the case of signal processing circuit 39, circuit 51 may comprise a capacitive type voltage divider.

The output terminals of signal processing circuits 39, 51 are coupled by conductors 54, 55 to the + and − input terminals of a suitable differential amplifier 56. The output terminal of amplifier 56 is connected to the user such as voltmeter 40 as described.

The operation of microdeflector 13 in the FIGS. 3 and 4 embodiment is the same as that described in connection with the FIGS. 1 and 2 embodiment, the capacitive relationship established between pickup electrode 28 and the photoconductive surface 35 producing a charge representative of the voltage on surface 35 on driven electrode 25 of finger 14. Any change in deflection of finger 14 changes the capacitive relation between variable capacitance electrode 26 and base 16, signal processing circuit 39 responding by outputting signal representing the voltage on photoconductive surface 35 to the + input terminal of amplifier 56.

Finger 14' of microdeflector 13', with application of the reference potential (Vref) to base 16, deflects and a charge is induced on both the driven and variable capacitance electrodes 25', 26' thereof in the manner described. The charge on variable capacitance electrode 26' is processed by signal processing circuit 51 and input to the −input terminal of amplifier 56.

Where the deflection of finger 14' of microdeflector 13' changes due for example to a change in ambient temperature conditions, mechanical vibrations, etc, (referred to generally as noise herein), the capacitance between finger 14' and base 16 changes with resulting change in the charge on variable capacitance electrode 26'. As a consequence, the signal output of signal processing circuit 51 to the −input terminal of amplifier 56 changes. Amplifier 56, which integrates the signal inputs from signal processing circuits 39, 51, responds by adjusting the output signal in compensation for the noise.

Figure 5:
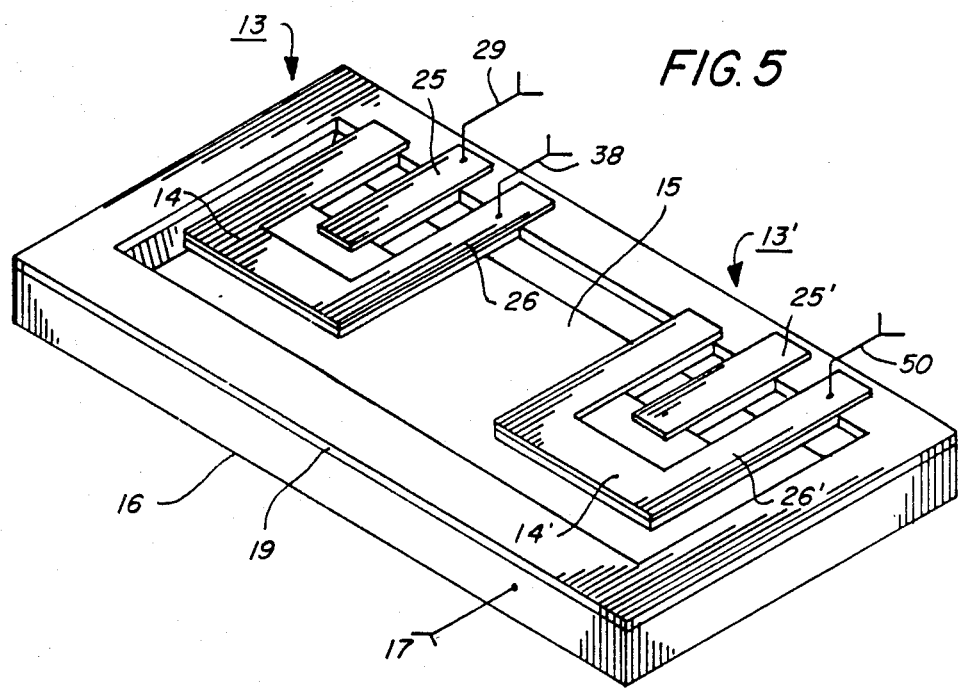
FIG. 5 is an isometric view of a second alternate microdeflector probe construction in which a pair of side by side microdeflectors are provided on a common substrate with common recess for the probe flexible fingers.

While a second recess 15' is shown and described, it will be understood that a common recess 15 of suitable length may be provided in accommodation of both fingers 14 and 14' as shown in FIG. 5 of the drawings. Further, the function of driven and variable capacitance electrodes (25, 26 in the FIGS. 1 and 2 embodiment, and 25', 25', 26, 26' in the FIGS. 3 and 4, and 5 embodiments) may be reversed such that electrode 26 (26') function as the driven electrode while electrode 25 (25') function as the variable capacitance electrode.

While the invention has been described with reference to the structure disclosed, it is not confined to the details set forth, but is intended to cover such modifications or changes as may come within the scope of the following claims.

We claim:
1. In an electrostatic voltmeter for measuring the voltage on a surface, the combination of:
   (a) a probe having at least one microdeflector, said microdeflector including
      (1) a base having a well therein;
      (2) a flexible finger on said base spaced over said well, said well permitting said finger to deflect relative to said base;
      (3) separate driven and sensing electrodes on said finger, said base and said electrodes cooperating to form a capacitive type relationship between said base and each of said electrodes individually; and
      (4) means for bringing said driven electrode into capacitive relation with said surface so that a charge representative of the voltage on said surface is produced on said driven electrode to cause said finger to deflect, deflection of said finger changing the capacitive relative between said base and said sensing electrode; and
   (b) means for converting a change in capacitance between said base and said sensing electrode to a signal representing the voltage on said surface.

2. The voltmeter according to claim 1 including means to bias said base to a predetermined reference potential whereby to pre-deflect said finger to a preset deflected position.

3. The voltmeter according to claim 1 in which said sensing electrode is generally U-shaped, said driven electrode being disposed within said sensing electrode and separated from said sensing electrode whereby said sensing electrode is electrically isolated from said driven electrode.

4. The voltmeter according to claim 1 in which said means for bringing said driven electrode into capacitive relation with said surface includes a pickup electrode disposable in predetermined spaced relation with said surface whereby a capacitive relationship is established between said surface and said pickup electrode, and means for electrically coupling said pickup electrode with said driven electrode.

5. The voltmeter according to claim 4 including a shutter interposable between said pickup electrode and said surface, said shutter being coupled to a predetermined voltage for calibrating said probe, and means for periodically interposing said shutter between said pickup electrode and said surface, interposition of said shutter between said pickup electrode and said surface causing predetermined deflection of said finger for use in calibrating said probe.

6. The voltmeter according to claim 1 including capacitance means in parallel with said driven electrode to control charge levels of said driven electrode.

7. The voltmeter according to claim 1 including
   a second microdeflector on said base for providing a signal reflecting changes in capacitance due to noise; and
   means for adjusting the signal output of the first mentioned microdeflector with the signal output of said second microdeflector to correct the signal output of said first microdeflector for noise.

8. The voltmeter according to claim 7 in which said second microdeflector is disposed in side by side relation with said first mentioned microdeflector.

9. The voltmeter according to claim 7 in which said well comprises an elongated recess, said second microdeflector flexible finger being disposed in side by side relation with said first microdeflector flexible finger.

* * * * *